United States Patent
Laskaris et al.

(10) Patent No.: US 10,416,254 B2
(45) Date of Patent: Sep. 17, 2019

(54) SYSTEM FOR REDUCING THERMAL SHIELD VIBRATIONS

(71) Applicant: General Electric Company, Schenectady, NY (US)

(72) Inventors: Evangelos Trifon Laskaris, Schenectady, NY (US); Longzhi Jiang, Florence, SC (US); Yihe Hua, Jiangsu (CN)

(73) Assignee: General Electric Company, Schenectady, NY (US)

( * ) Notice: Subject to any disclaimer, the term of this patent is extended or adjusted under 35 U.S.C. 154(b) by 657 days.

(21) Appl. No.: 14/781,125

(22) PCT Filed: Mar. 26, 2014

(86) PCT No.: PCT/US2014/031892
§ 371 (c)(1),
(2) Date: Sep. 29, 2015

(87) PCT Pub. No.: WO2014/160795
PCT Pub. Date: Oct. 2, 2014

(65) Prior Publication Data
US 2016/0054406 A1    Feb. 25, 2016

(30) Foreign Application Priority Data
Mar. 29, 2013  (CN) .......................... 2013 1 0110166

(51) Int. Cl.
*G01R 33/385* (2006.01)
*G01R 33/38* (2006.01)

(52) U.S. Cl.
CPC ..... *G01R 33/3856* (2013.01); *G01R 33/3802* (2013.01); *G01R 33/3804* (2013.01)

(58) Field of Classification Search
CPC ............ G01R 33/3804; G01R 33/3802; G01R 33/3856
See application file for complete search history.

(56) References Cited

U.S. PATENT DOCUMENTS 5,225,782 A * 7/1993 Laskaris ............ G01R 33/3815
                                                              324/318
5,317,298 A * 5/1994 Dorri ................. G01R 33/3873
                                                              324/319

(Continued)

FOREIGN PATENT DOCUMENTS

| CN | 1886671 A | 12/2006 |
|----|-----------|---------|
| CN | 101216540 A | 7/2008 |
| CN | 201177660 Y | 1/2009 |

OTHER PUBLICATIONS

Unofficial English translation of Chinese Office Action issued in connection with corresponding CN Application No. 201310110166.4 dated Mar. 30, 2016.

(Continued)

*Primary Examiner* — Patrick Assouad
*Assistant Examiner* — Haidong Zhang

(57) ABSTRACT

A magnetic resonance imaging system includes at least one gradient coil, at least one coil former, a thermal shield assembly, and at least one linking member. The at least one gradient coil generates at least one gradient field along at least one direction in response to pulsed signals. The at least one coil former is attached with at least one coil. The thermal shield assembly is arranged adjacent to the at least one coil former. The at least one linking member is configured for increasing mechanical rigidity of the thermal shield assembly by mechanically linking at least a part of the thermal shield assembly with the at least one coil former. As a result, mechanical vibrations of the thermal shield assembly can be reduced.

10 Claims, 13 Drawing Sheets

(56) References Cited

U.S. PATENT DOCUMENTS

| | | |
|---|---|---|
| 5,539,367 A | 7/1996 | Xu et al. |
| 5,586,437 A | 12/1996 | Blecher et al. |
| 5,691,679 A * | 11/1997 | Ackermann ............ H01F 6/065 |
| | | 335/216 |
| 5,801,609 A * | 9/1998 | Laskaris .............. G01R 33/421 |
| | | 324/319 |
| 6,147,494 A | 11/2000 | Ham |
| 6,326,788 B1 | 12/2001 | Mulder et al. |
| 6,501,275 B1 | 12/2002 | Westphal |
| 6,707,302 B2 | 3/2004 | Ries |
| 7,514,928 B2 | 4/2009 | Westphal |
| 7,665,312 B2 | 2/2010 | Jonas et al. |
| 7,852,629 B2 | 12/2010 | Yu |
| 8,033,121 B2 | 10/2011 | Huang et al. |
| 2004/0251901 A1 | 12/2004 | Tsuda et al. |
| 2007/0108979 A1 | 5/2007 | Ryan et al. |
| 2008/0315878 A1 | 12/2008 | Ham |
| 2010/0041976 A1 | 2/2010 | Gore et al. |
| 2010/0099976 A1 | 4/2010 | Kauchi et al. |
| 2011/0148416 A1 * | 6/2011 | Jiang .................. G01R 33/3802 |
| | | 324/318 |
| 2011/0284191 A1 | 11/2011 | Jiang |
| 2012/0075045 A1 * | 3/2012 | Calvert .............. G01R 33/3804 |
| | | 335/216 |
| 2012/0184444 A1 | 7/2012 | Blumenthal et al. |
| 2012/0202697 A1 | 8/2012 | Calvert |

OTHER PUBLICATIONS

Katsunuma et al., "Quiet MRI with Novel Acoustic Noise Reduction", Magnetic Resonance Materials in Physics, Biology and Medicine, vol. 13, Issue 3, pp. 139-144, 2001.

Wang et al., "Development of Conduction-Cooled Superconducting Magnet for Baby Imaging", IEEE Transactions on Applied Superconductivity, vol. 20, Issue 3, pp. 726-731, Jun. 2010.

Huang et al., "High Magnetic Field Superconducting Magnet With Zero Helium Boil-Off for Nuclear Magnetic Resonance Spectrometer", IEEE Transactions on Applied Superconductivity, vol. 20, Issue 3, pp. 748-751, Jun. 2010.

Cosmus et al., "Advances in Whole-Body MRI Magnets", IEEE Transactions on Applied Superconductivity, vol. 21, Issue 3, pp. 2104-2109, 2011.

Zhai et al., "Eddy-Current Analysis of Cold Mass and Thermal Shield for Series-Connected Hybrid Magnet", IEEE Transactions on Applied Superconductivity, vol. 21, Issue 2, pp. 42-47, Apr. 2011.

International Search Report and Written Opinion issued in connection with corresponding application PCT/US2014/031892 dated Aug. 13, 2014.

* cited by examiner

SYSTEM FOR REDUCING THERMAL SHIELD VIBRATIONS

BACKGROUND

At least some known magnetic resonance imaging (MRI) systems employ a thermal shield assembly for preventing heat from being radiated or transferred from a warm region where an object (e.g., a patient) is being imaged to a cold region where one or more main magnets or main coils are positioned. However, since the thermal shield assembly is typically made of metal materials, such as aluminum, eddy current will be induced on at least a part of the body of the thermal shield when a gradient coil assembly of the MRI system is driven by pulsed current signals to impose one or more gradient fields on a main magnetic field generated by the main magnet or the main coils. The induced eddy current interacts with the main magnetic field and produces significant Lorentz force on the thermal shield. The Lorentz force may excite one or more thermal shield resonance modes or cause the thermal shield assembly to vibrate. The resulting effect of such vibrations or resonances is that significant heat will be generated on the main magnet or main coils, which may cause excessive cryogen or coolant boil-off and may potentially quench the main magnet or the main coils in some circumstances.

BRIEF DESCRIPTION

In accordance with one or more embodiments disclosed herein, an exemplary magnetic resonance imaging system is provided. The magnetic resonance imaging system includes at least one gradient coil, at least one coil former, a thermal shield assembly, and at least one linking member. The gradient coil is configured for generating at least one gradient field along at least one direction in response to pulsed signals supplied thereto. The coil former is configured for attaching at least one coil thereto. The thermal shield assembly is arranged adjacent to the coil former. The linking member is configured for increasing mechanical rigidity of the thermal shield assembly by mechanically linking at least a part of the thermal shield assembly with the coil former, so as to reduce mechanical vibrations of the thermal shield assembly at least caused by interactions between gradient coil induced eddy current and a magnetic field.

DRAWINGS

These and other features and aspects of embodiments of the present disclosure will become better understood when the following detailed description is read with reference to the accompanying drawings in which like characters represent like parts throughout the drawings, wherein.

Figure 1:
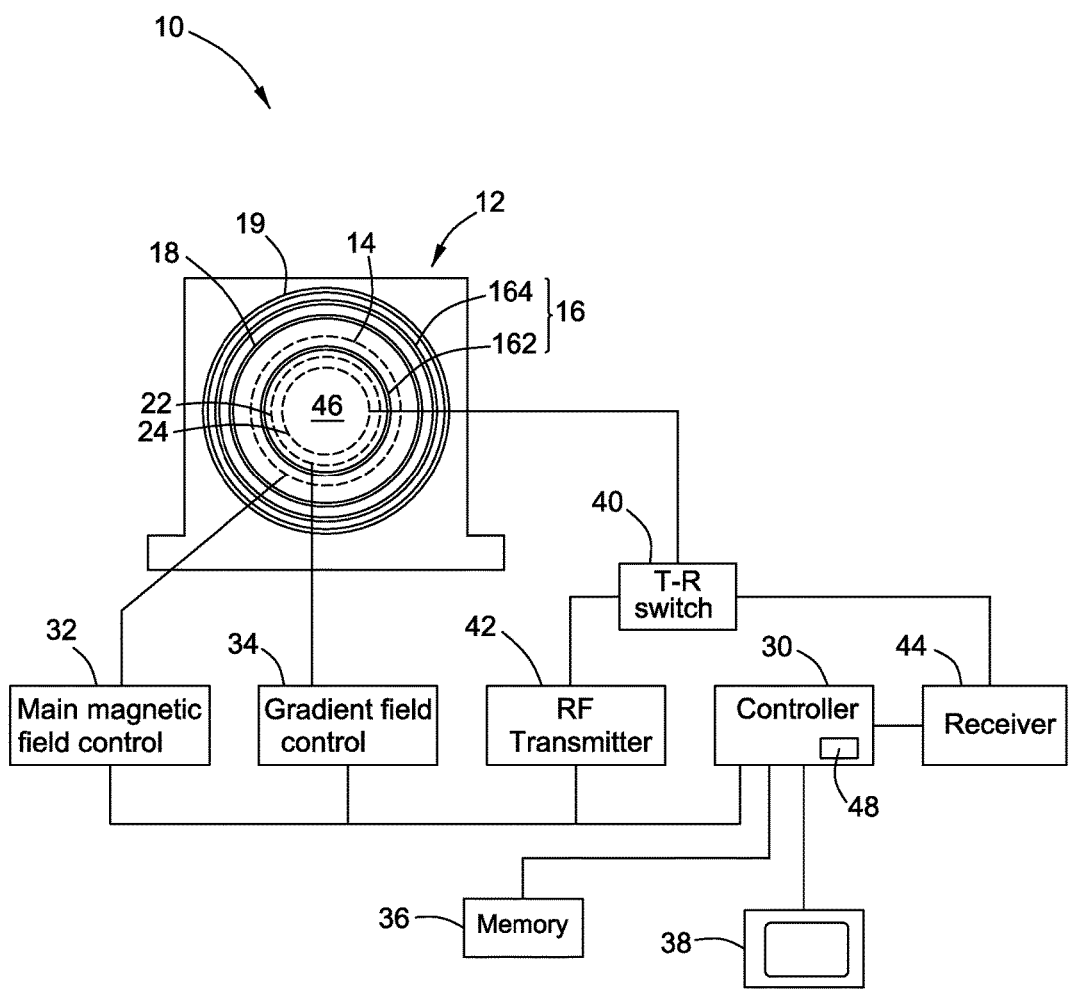
FIG. 1 is a schematic block diagram of an imaging system in accordance with an exemplary embodiment of the present disclosure.
Figure 13:
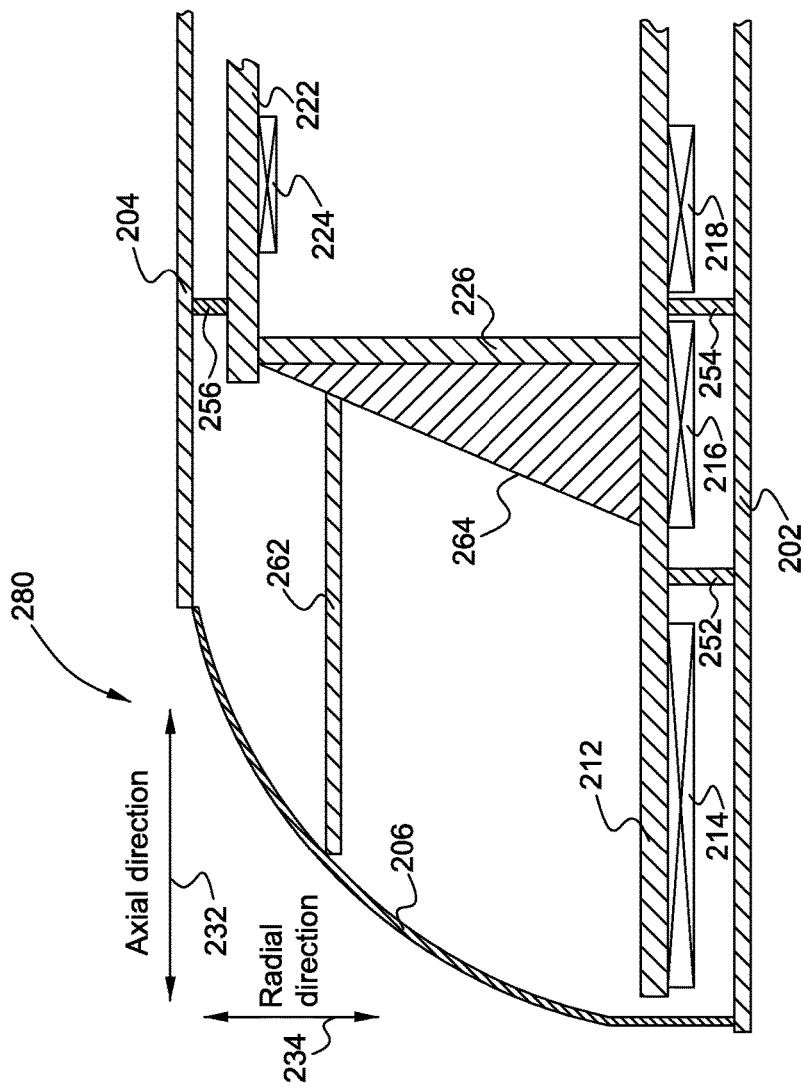
Figure 14:
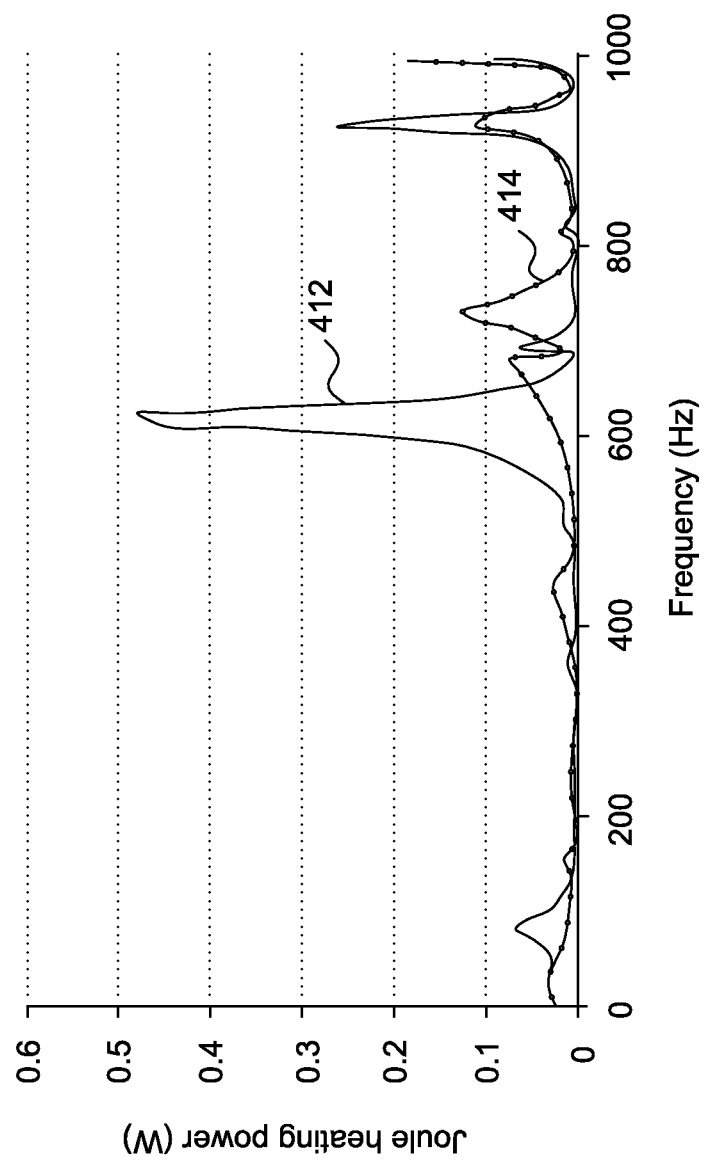

FIG. 13 is a cross-sectional side view of at least a part of a thermal shield assembly in association with other components of the imaging system shown in FIG. 1 in accordance with another exemplary embodiment of the present disclosure; and FIG. 14 illustrates two curves of frequency related Joule heating power generated by a conventional thermal shield and one proposed improved thermal shield in accordance with an exemplary embodiment of the present disclosure.

DETAILED DESCRIPTION

Exemplary embodiments disclosed herein are generally directed to systems with new configurations that can help reduce mechanical vibrations produced by a thermal shield assembly employed in an imaging system, for example, a magnetic resonance imaging (MRI) system. More specifically, in the present disclosure, stiffening means are provided to stiffen the thermal shield assembly so as to increase the mechanical rigidity of the thermal shield assembly. In some embodiments, the stiffening means may be provided in a manner to break one or more resonance modes that are excited due to interactions between gradient coil induced eddy current and main magnetic field. In some embodiments, a plurality of linking members (or can be referred to as struts) are used to mechanically connect at least a part of the thermal shield assembly with at least one coil former to increase the mechanical rigidity of the thermal shield assembly.

One technical benefit of the proposed solution of stiffening the thermal shield assembly is that mechanical vibrations of the thermal shield caused by gradient coil induced eddy current can be reduced. In addition, the proposed solution of stiffening the thermal shield avoids excessive coolant (e.g., liquid helium) boil-off. Also, potentially quench of the main magnet can be avoided.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first," "second," and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising," or "having," and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, terms "circuit," "circuitry," and "controller" may include either a single component or a plurality of components, which are either active and/or passive and are connected or otherwise coupled together (e.g., as one or more integrated circuit chips) to provide the described function.

Turning now to the drawings, FIG. 1 illustrates a schematic block diagram of an imaging system 10 in accordance with an exemplary embodiment of the present disclosure. The imaging system 10 may be specifically implemented as a magnetic resonance imaging (MRI) system for obtaining anatomical images inside of a human object. In other embodiments, the imaging system 10 may be used to image non-human objects or for spectroscopy applications.

In the exemplary embodiment, the imaging system 10 includes a main magnet assembly 12 that includes a main magnet 14. In some embodiments, the main magnet 14 may be a superconducting magnet formed from a plurality of magnetic coils wound around a magnetic coil support or a coil former. In other embodiments, the main magnet 14 may be a permanent magnet. The main magnet assembly 12 may include a cryostat vessel 18 that surrounds the main magnet 14. The cryostat vessel 18 is typically filled with a cryogenic fluid, such as liquid helium and/or nitrogen, which is used to cool the superconducting coils into an extremely low temperature, such that electric current can continue to flow through the superconducting coils to maintain a uniform and static main magnetic field after a power supply is disconnected.

In the exemplary embodiment, the main magnet assembly 12 may also include a thermal shield assembly 16 that enclose the cryostat vessel 18 and the main magnet 14 therein. In one embodiment, the thermal shield assembly 16 may include an inner thermal shield member 162 and an outer thermal shield member 164. The inner thermal shield member 162 is generally cylindrical in shape and is radially placed inside of the main magnet 14. The inner thermal shield member 162 is configured to prevent heat being radiated from a warm region where an object or patient is placed to a cold region where the main magnet 14 is placed. The outer thermal shield member 164 is arranged concentrically with respect to the inner thermal shield member 162. The outer thermal shield member 164 may also have a generally cylindrical shape and is radially placed outside of the main magnet 14. The outer thermal shield member 164 is configured to prevent heat being radiated from the environment into the main magnet 14.

In some embodiments, the thermal shield 16 may be made from metal materials, such as aluminum, which may generate eddy current due to interaction with a changing electromagnetic field. In one embodiment, one type of the changing electromagnetic field may be generated by one or more gradient coils by pulsed current signals. In some embodiments, the main magnet assembly 12 may also include a vacuum vessel 19 surrounding the thermal shield 16 and insulating the main magnet 14 from the environment during operation.

In the exemplary embodiment, the imaging system 10 also includes a gradient coil assembly 22 placed inside of the inner thermal shield member 162. The gradient coil assembly 22 is configured to selectively impose one or more gradient magnetic fields along one or more axes. In some embodiments, the gradient coil assembly 22 may have shielded or unshielded configurations. As used herein, "shielded configuration" refers to one or more shielding gradient coils may be provided to generate opposing magnetic fields to cancel fringe fields produced by normal gradient coils. The gradient coil assembly 22 may include an x-axis gradient coil which is configured to impose x-axis gradient fields along x-axis direction in response to first pulsed current signals supplied thereto. The gradient coil assembly 22 may also include a y-axis gradient coil which is configured to impose y-axis gradient fields along y-axis direction in response to second pulsed current signals supplied thereto. The gradient coil assembly 22 may also include a z-axis gradient coil which is configured to impose z-axis gradient fields along z-axis direction in response to third pulsed current signals supplied thereto. The gradient fields generated by the gradient coil assembly 22 allow spatial information of radio-frequency signals emanated from exited nuclei inside a human body to be identified.

Referring to FIG. 1, the imaging system 10 also includes a controller 30, a main magnetic field control 32, a gradient field control 34, a memory 36, a display device 38, a transmitter (T-R) switch 40, an RF transmitter 42, and a receiver 44.

In operation, a body of an object, such as a patient (not shown), or a phantom to be imaged, is placed in a bore 46 on a suitable support, for example, a motorized table (not shown) or other patient table. The main magnet 14 produces a uniform and static main magnetic field $B_0$ across the bore 46. The strength and homogeneity of the main magnet field $B_0$ in the bore 46 and correspondingly in the patient, is controlled by the controller 30 via the main magnetic field control 32, which also controls a supply of energized current to the main magnet 14. The gradient coil assembly 22 is energized by the gradient field control 34 and is also controlled by the controller 30, so that one or more gradient magnetic fields can be imposed on the main magnetic field $B_0$.

The RF transmit coil 24, which may include a plurality of coils (e.g., resonant surface coils), is arranged to transmit magnetic pulses and/or optionally simultaneously detect MR signals from the patient, if receive coil elements are also provided. The RF transmit coil 24 and a receive surface coil, if provided, may be selectively interconnected to one of the RF transmitter 42 or receiver 44, respectively, by the T-R switch 40. The RF transmitter 42 and the T-R switch 40 are controlled by the controller 30 such that RF field pulses or signals are generated by the RF transmitter 42 and are selectively applied to the patient for excitation of magnetic resonance in the patient.

Following application of the RF pulses, the T-R switch 40 is again actuated to decouple the RF transmit coil 24 from the RF transmitter 42. The detected MR signals are in turn communicated to the controller 30 which may organize the MR signals in a particular format for storage in the memory 36. The controller 30 may include a processor 48 that controls the processing of the MR signals to produce signals representative of an image of the patient. The processed signals representative of the patient are transmitted to the display 38 to provide a visual display of the image.

Figure 2:
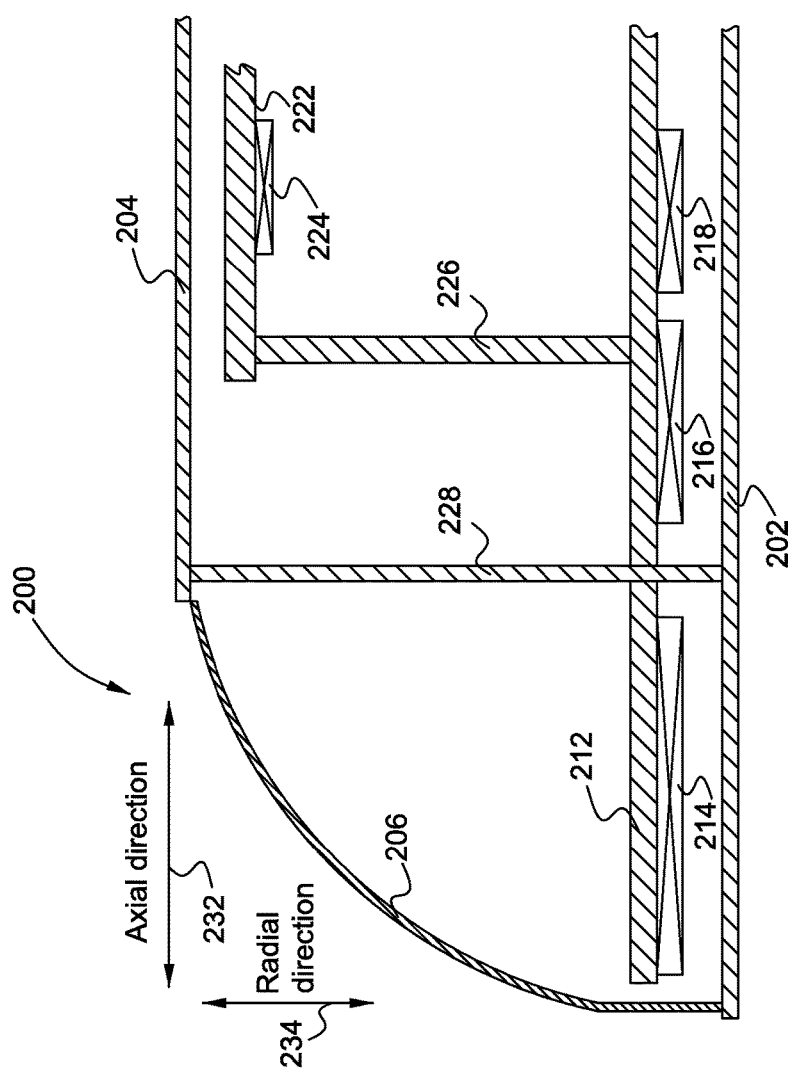
FIG. 2 is a cross-sectional side view of at least a part of a thermal shield assembly in association with other components of the imaging system shown in FIG. 1 in accordance with one exemplary embodiment of the present disclosure.

FIG. 2 is a cross-sectional side view of at least a part of a thermal shield assembly 200 in association with other components of the imaging system 10 shown in FIG. 1 in accordance with one exemplary embodiment of the present disclosure. Referring to FIG. 2, the thermal shield assembly 200 includes an inner thermal shield member 202 and an outer thermal shield member 204 joined together by one or more flanges 206. In the illustrated embodiment, although only one flange 206 having a curved shape is shown at the one end (or the left-hand side), it can be understood that the other end (or the right-hand side) of the inner and outer thermal shield members 202, 204 can be symmetrically arranged with a curved flange 206 which is used to join the other ends of the inner and outer thermal shield members 202, 204. The inner and outer thermal shield members 202, 204 are spaced apart along a radial direction 234 to form an accommodating space to enclose various components therein. For purposes of clarity, in the illustrated embodiment, a main coil former 212, a plurality of main coils 214, 216, 218, a bucking coil former 222, a bucking coil 224, and a support member 226 are shown to be enclosed in the accommodating space at least defined by the inner and outer thermal shield members 202, 204. In other embodiments, other components such as cooling arrangements can be placed inside of the accommodating space.

Further referring to FIG. 2, in one embodiment, one or more linking members 228 are provided for mechanically connecting the inner thermal shield member 202 with the outer thermal shield member 204. The one or more linking members 228 may be made of materials having high rigidity so that the thermal shield assembly 200 can be stiffened to have increased mechanical rigidity. In addition, the one or more linking members 228 may be made of materials having high thermal resistance to avoid unwanted heat transfer or conduction between the main coils and the thermal shield assembly 200. In the illustrated embodiment, the one or more linking members 228 are generally configured to have a rod shape and extend from an outer side of the inner thermal shield member 202 to an inner side of the outer thermal shield member 204 along the radial direction 234. This arrangement can increase the mechanical rigidity of the thermal shield assembly 200 along the radial direction 234. The specific positions that the one or more linking members 228 may be connected to the inner and outer thermal shield members 202, 204 may be determined according to a number of factors, including, but not limited to design of main coils and gradient coils, dimension or size of the thermal shield assembly 200. In the illustrated embodiment, the one or more linking members 208 are generally placed at a region between a first main coil 214 having a large size and a second main coil 216 having a medium size. In addition, in some embodiments, multiple linking members 228 may be provided and distributed in a same plane.

Further referring to FIG. 2, in some embodiments, the one or more linking members 228 may be arranged to pass through the main coil former 212 which is used for attaching main coils 214, 216, 218 thereto. In the illustrated embodiments, a single-piece main coil former 212 is positioned adjacent to the inner thermal shield 202 for attaching three set of main coils 214, 216, 218 with varied dimensions thereto. The single-piece main coil former 212 may be cut with one or more through holes for the one or more linking members 228 to pass through, so that the inner and outer thermal shield members 202, 204 can be mechanically connected. In some embodiments, bonding material (e.g., epoxy) or any other fastening means may be used to firmly connect the one or more linking members 228 with the main coil former 212. Therefore, the mechanical rigidity of the thermal shield assembly 200 can be further increased. In other embodiments, the main coil former 212 may be arranged to have multiple pieces, and each main coil former piece can be wound with a corresponding main coil. In the multiple main coil formers case, the one or more linking members 228 may be mechanically connected to at least one of the main coil formers.

Further, in the illustrated embodiment of FIG. 2, the one or more linking members 228 are arranged to be perpendicular to the inner thermal shield member 202 and the outer thermal shield member 204. In other embodiments, the one or more linking members 228 may be arranged to be non-perpendicular with respect to the inner or outer thermal shield members 202, 204. One example of the non-perpendicular arrangements of the linking members 228 is shown in FIG. 3.

Figure 3:
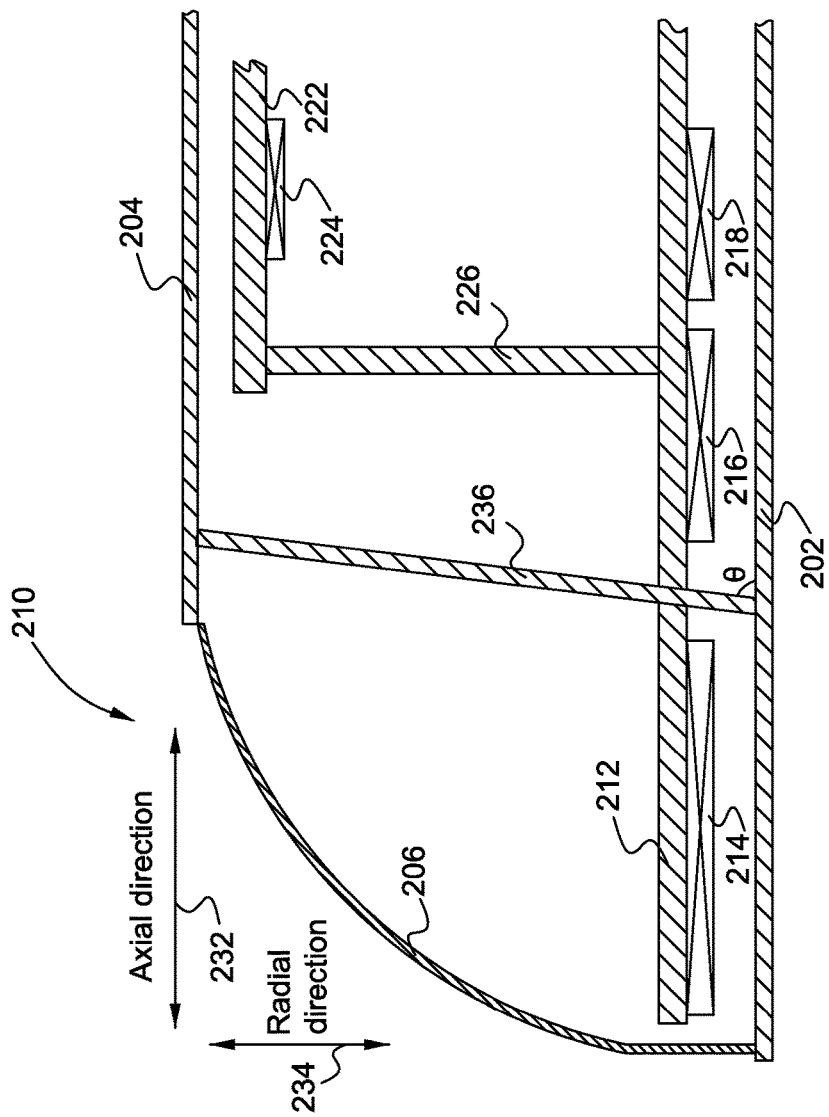
FIG. 3 is a cross-sectional side view of at least a part of a thermal shield assembly in association with other components of the imaging system shown in FIG. 1 in accordance with another exemplary embodiment of the present disclosure.

Referring to FIG. 3, a cross-sectional side view of at least a part of the thermal shield assembly 210 in association with other components of the imaging system shown 10 in FIG. 1 in accordance with another exemplary embodiment of the present disclosure is illustrated. The general structure of the thermal shield assembly 210 shown in FIG. 3 is substantially similar to the thermal shield assembly shown and described with reference to FIG. 2, thus, similar elements shown in FIG. 3 are designated with the same reference numerals as those shown in FIG. 2 and detailed descriptions of these elements will not be described in detail. In the illustrated embodiment of FIG. 3, the thermal shield assembly 210 includes a plurality of linking members 236 mechanically coupled between the inner thermal shield member 202 and the outer thermal shield member 204. Each of the plurality of linking members 236 has one end firmly connected to the inner thermal shield member 202 and an opposing end firmly connected to the outer thermal shield member 204. More specifically, the plurality of linking members 236 are arranged in a manner that an angle $\theta$ is formed between each linking member 236 and the inner thermal shield member 202. The value of the angle $\theta$ can be varied between 0 and 90 degrees.

In some embodiments, the plurality of linking members 236 may further pass through the main coil former 212 and are also mechanically coupled to the main coil former 212 to further increase the mechanical rigidity of the thermal shield assembly 210. During operation, the non-perpendicular arrangement of the plurality of linking members 236 with respect to the inner and outer thermal shield members 202, 204 can reduce mechanical vibrations along the radial direction 234 and the axial direction 232. Reduced mechanical vibrations in turns leads to a reduced heat generated therefrom, and excessive liquid cryogen such as liquid helium boil-off can be avoided.

Figure 4:
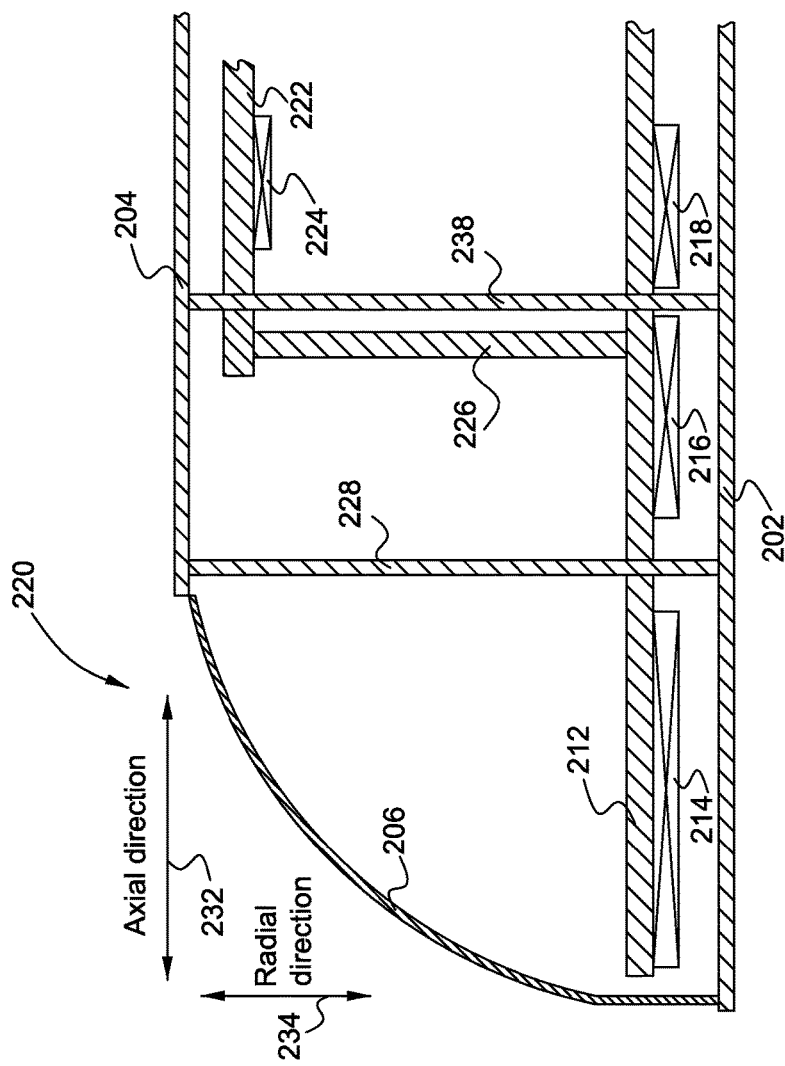
FIG. 4 is a cross-sectional side view of at least a part of a thermal shield assembly in association with other components of the imaging system shown in FIG. 1 in accordance with another exemplary embodiment of the present disclosure.

FIG. 4 is a cross-sectional side view of at least a part of a thermal shield assembly 220 in association with other components of the imaging system 10 shown in FIG. 1 in accordance with another exemplary embodiment of the present disclosure. The general structure of the thermal shield assembly 220 shown in FIG. 4 is substantially similar to the thermal shield assembly 200 shown and described with reference to FIG. 2, thus, similar elements shown in FIG. 4 are designated with the same reference numerals as those shown in FIG. 2 and detailed descriptions of these elements will not be described in detail.

In the illustrated embodiment of FIG. 4, the thermal shield assembly 220 includes a first set of linking members 228 and a second set of linking members 238. Although two sets of linking members are shown, in other embodiments, the thermal shield assembly 220 may include more than two sets of linking members. The first set of linking members 228 is disposed at a first position along the axial direction 232. In the illustrated embodiment, the first position is located in a region defined between the first main coil 214 with a large size and a second main coil 216 with a medium size. The first set of linking members 228 may be distributed evenly or unevenly in a first radial plane which is perpendicular to the axial direction 232. Each of the first set of linking members 228 is mechanically connected to the inner and outer thermal shield members 202, 204. Similar to what have been described with reference to FIGS. 2 and 3, the first set of the linking members 228 can be arranged to be perpendicular or non-perpendicular with respect to the inner and outer thermal shield members 202, 204. In some embodiments, the first set of linking members 228 can be further mechanically connected to the main coil former 212 to increase the mechanical rigidity of the thermal shield assembly 220, such that one or more resonance modes can be broken or the mechanical vibration generated due to gradient coil induced eddy current can be reduced.

Further referring to FIG. 4, the second set of linking members 238 is disposed at a second position along the axial direction 232. The second position is located in a region defined by the second main coil 216 having a medium size and a third main coil 218 having a small size. The second set of linking members 238 may be distributed evenly or unevenly in a second radial plane which is perpendicular to the axial direction 232. Each of the first set of linking members 228 is also mechanically connected to the inner and outer thermal shield members 202, 204 to increase the mechanical rigidity of the thermal shield assembly 220. Similar to what have been described with reference to FIGS. 2 and 3, the second set of the linking members 238 can also be arranged to be perpendicular or non-perpendicular with respect to the inner and outer thermal shield members 202, 204. In some embodiments, the second set of linking members 238 are further mechanically connected to the main coil former 212 to further increase the mechanical rigidity. Moreover, in some embodiments, the second set of linking members 238 may be further mechanically connected to the bucking coil former 222 to further increase mechanical rigidity of the thermal shield assembly 220.

Figure 5:
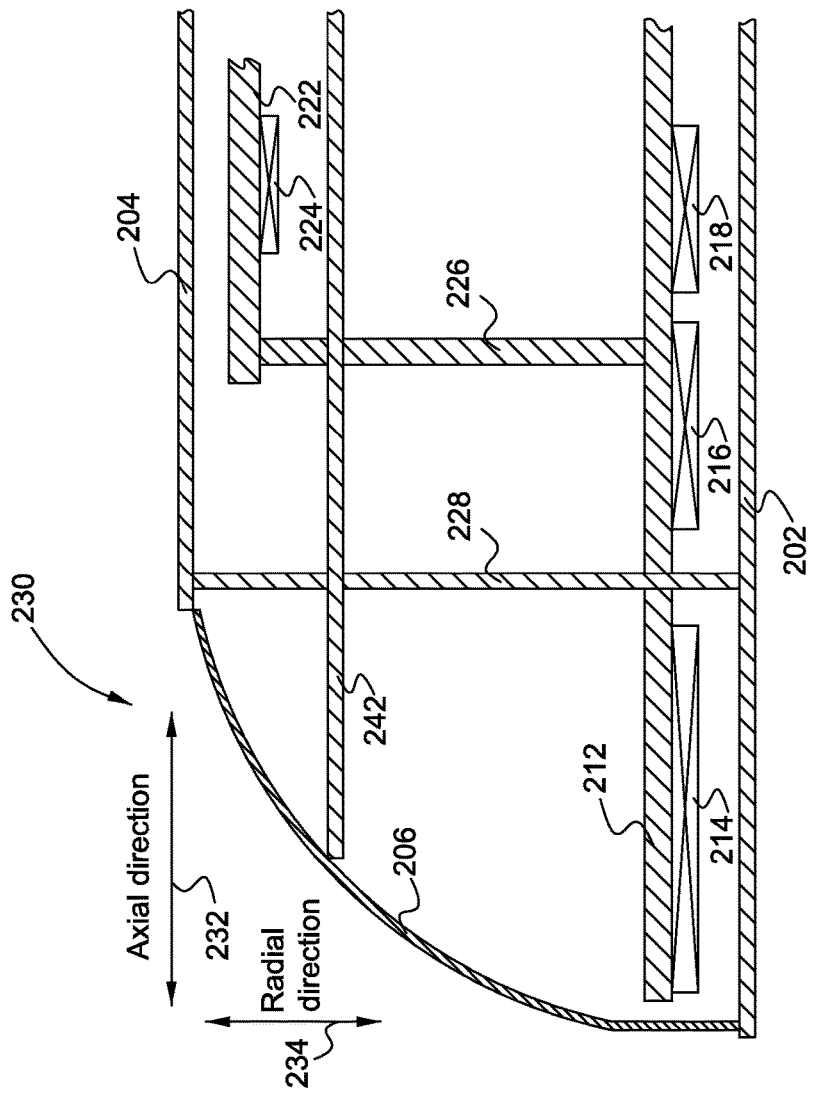
FIG. 5 is a cross-sectional side view of at least a part of a thermal shield assembly in association with other components of the imaging system shown in FIG. 1 in accordance with another exemplary embodiment of the present disclosure.

FIG. 5 is a cross-sectional side view of at least a part of a thermal shield assembly 230 in association with other components of the imaging system 10 shown in FIG. 1 in accordance with another exemplary embodiment of the present disclosure. The general structure of the thermal shield assembly 230 shown in FIG. 5 is substantially similar to the thermal shield assembly 200 shown and described with reference to FIG. 2, thus, similar elements shown in FIG. 5 are designated with the same reference numerals as those shown in FIG. 2 and detailed descriptions of these elements will not be described in detail.

In the illustrated embodiment of FIG. 5, the thermal shield assembly 230 includes a plurality of radial linking members 228 and a plurality of axial liking members 242. The plurality of radial linking members 228 are mechanically connected to the inner and outer thermal shield members 202, 204 along the radial direction 234, such that mechanical vibrations produced along the radial direction 234 can be reduced. The plurality of axial linking members 242 are mechanically connected to two flanges 206 which are used to join the inner and outer thermal shield members 202, 204 at two ends. The introduction of the plurality of axial linking members 242 can reduce mechanical vibrations of the thermal shield assembly 230 along the axial direction 232. In some embodiments, the plurality of axial linking members 242 may be further mechanically connected to a support member 226 which is used for joining the bucking coil former 222 with the main coil former 212. Connecting the plurality of axial linking members 242 with the support member 226 can further increase the mechanical rigidity along the axial direction 232, thus, mechanical vibrations along the axial direction 232 can be reduced.

Figure 6:
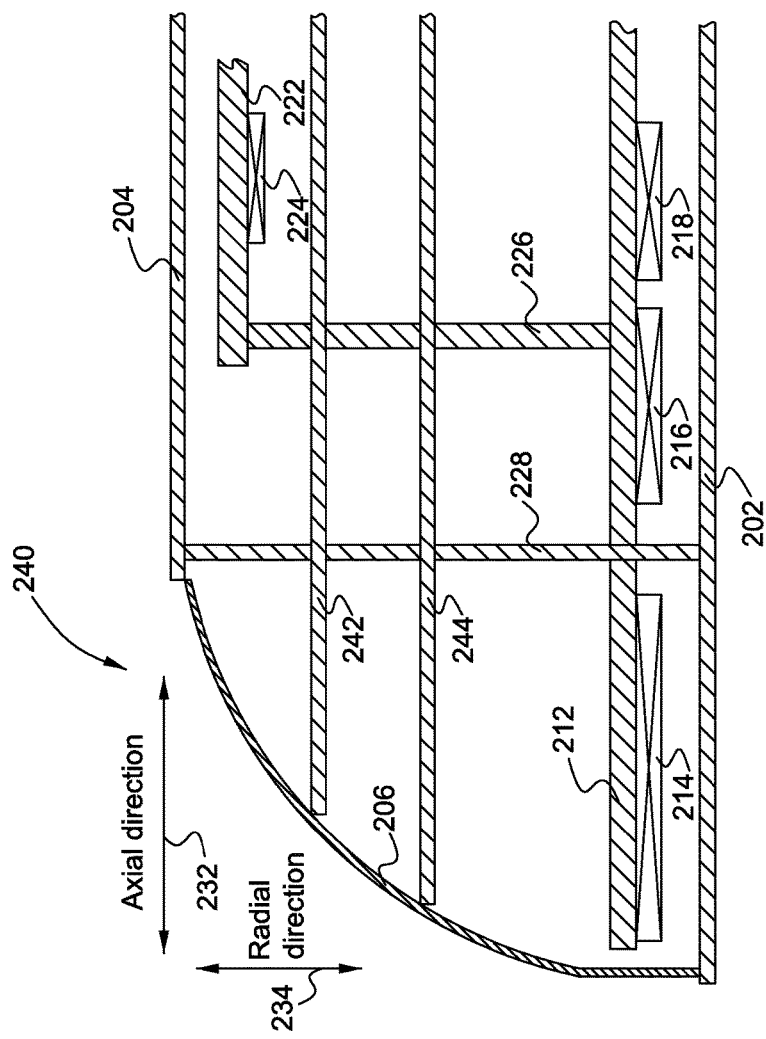
FIG. 6 is a cross-sectional side view of at least a part of a thermal shield assembly in association with other components of the imaging system shown in FIG. 1 in accordance with another exemplary embodiment of the present disclosure.

FIG. 6 is a cross-sectional side view of at least a part of a thermal shield assembly 240 in association with other components of the imaging system 10 shown in FIG. 1 in accordance with another exemplary embodiment of the present disclosure. The general structure of the thermal shield assembly 240 shown in FIG. 6 is substantially similar to the thermal shield assembly 200 shown and described with reference to FIG. 2, thus, similar elements shown in FIG. 6 are designated with the same reference numerals as those shown in FIG. 2 and detailed descriptions of these elements will not be described in detail.

In the illustrated embodiment of FIG. 6, the thermal shield assembly 240 includes a first set of axial linking members 242 and a second set of axial linking members 244. The first set of axial linking members 242 is disposed at a first position along the radial direction 234. The second set of axial linking members 244 is disposed at a second position along the radial direction 234. Each of the first set axial linking members 242 is firmly connected to the two flanges 206 by one or more fastening means such as screws. Similarly, each of the second set of axial linking members 244 is firmly connected to the two flanges 206 by one or more fastening means such as screws. The mechanical rigidity of the thermal radiation shield 240 along the axial direction 232 can be further increased by making rigid connection between the two flanges 206 using the first and second set of axial linking members 242. Therefore, resonance modes along the axial direction 232 or mechanical vibrations produced along the axial direction 232 can be reduced.

Figure 7:
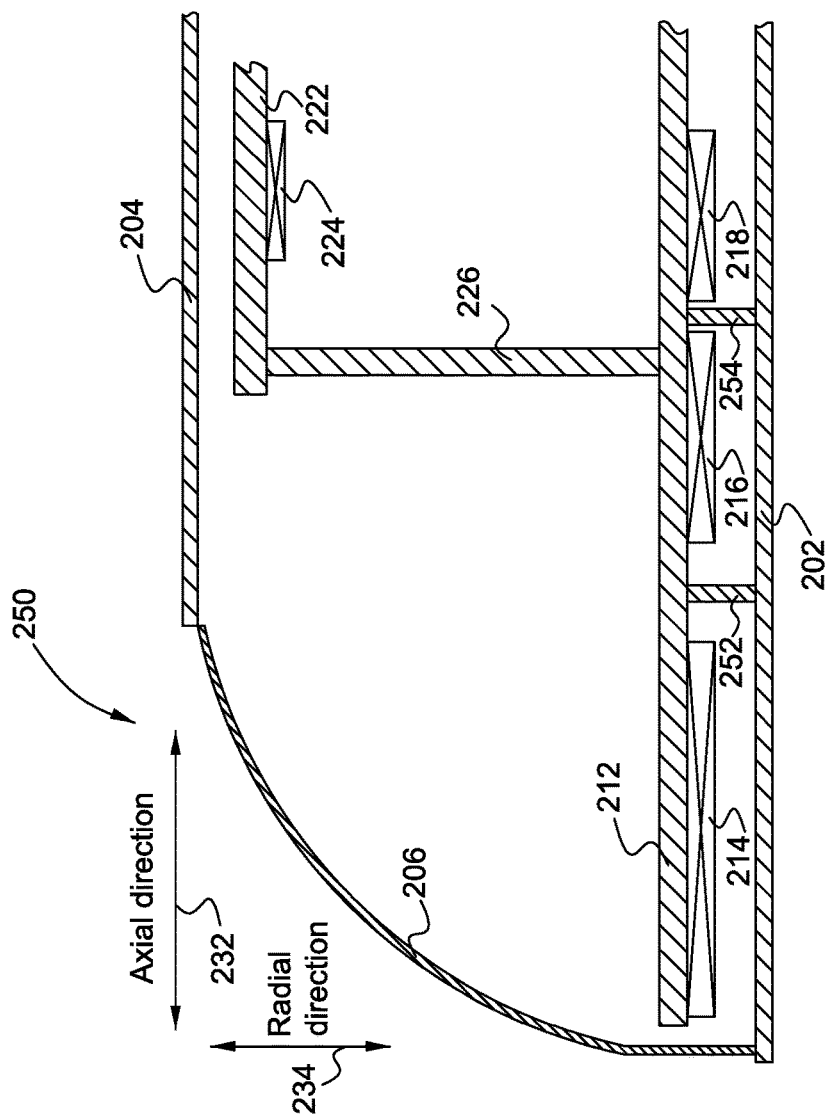
FIG. 7 is a cross-sectional side view of at least a part of a thermal shield assembly in association with other components of the imaging system shown in FIG. 1 in accordance with another exemplary embodiment of the present disclosure.

FIG. 7 is a cross-sectional side view of at least a part of a thermal shield assembly 250 in association with other components of the imaging system shown in FIG. 1 in accordance with another exemplary embodiment of the present disclosure. The general structure of the thermal shield assembly 240 shown in FIG. 7 is substantially similar to the thermal shield assembly shown and described with reference to FIG. 2, thus, similar elements shown in FIG. 7 are designated with the same reference numerals as those shown in FIG. 2 and detailed descriptions of these elements will not be described in detail.

In the illustrated embodiment of FIG. 7, the thermal shield assembly 250 may include a first set of linking members (can also be referred to as struts or pillars) 252 and a second set of linking members 254. Although two sets of linking members 252, 254 are shown in the illustrated embodiment, in other embodiments, the thermal shield assembly 250 may include more than two sets of linking members. The first set of linking members 252 are disposed between the inner thermal shield member 202 and the main coil former 212. Each of the first set of linking members 252 has one end mechanically connected to the inner thermal radiation member 202 and an opposing end mechanically connected to the main coil former 212. In one embodiment, bonding materials such as epoxy can be used to firmly connect one end of the linking member 252 with the main coil former 212 and the other end of the linking member 252 may be firmly connected to the inner thermal shield member 202 by fastening means such as screws. Also, similar to the embodiments shown and described above with reference to FIGS. 2-3, the first set of linking members 252 can be arranged to be perpendicular to the inner thermal shield member 202. In other embodiments, the first set of linking members 252 can also be arranged to be non-perpendicular to the inner thermal shield member 202.

Figure 8:
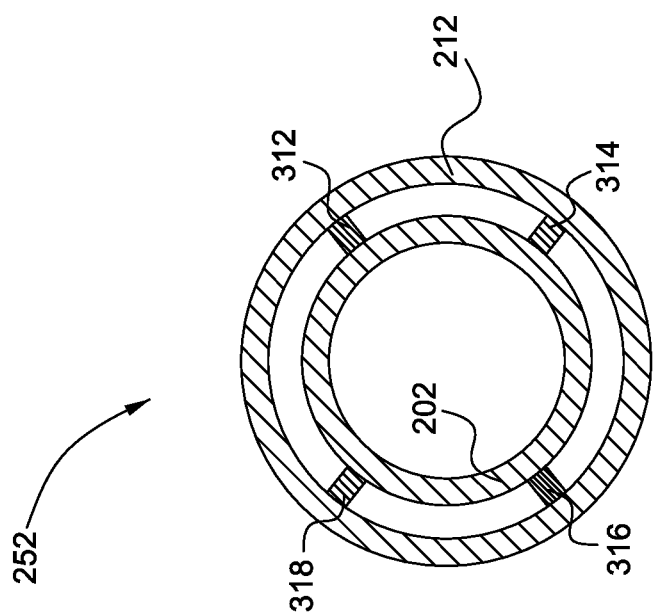
FIG. 8 is a radial cross-sectional view of a first set of inner radial linking members shown in FIG. 7 in accordance with an exemplary embodiment of the present disclosure.

Further referring to FIG. 7, the first set of linking members 252 is disposed in a first position along the axial direction 232. The first position is located at a region defined by a first main coil 214 and a second main coil 216. In some embodiments, the first position may be particularly selected such that one or more resonance modes generated due to the gradient coil induced eddy current can be effectively broken or the mechanical vibrations can be effectively reduced. The distribution of the first set of linking members 252 can be best seen with reference to FIG. 8, in which a cross-sectional view of the first set of linking members 252 in accordance with an exemplary embodiment of the present disclosure is shown. As shown in FIG. 8, the first set of linking members 252 include a first linking member 312, a second linking member 314, a third linking member 316, and a fourth linking member 318. Each of the four linking member 312, 314, 316, 318 is mechanically connected to the inner thermal shield member 202 and the main coil former 212. In the illustrated embodiment, the four linking members 312, 314, 316, 318 are distributed evenly in the circumferential direction or spaced apart from one another by 90 degrees. With this configuration, at least four resonance modes generated due to gradient coil induced eddy current can be broken. In some specific embodiments, the first linking member 312 and the third linking member 316 may be configured to break resonance mode or reduce mechanical vibrations generated due to x-axis gradient coil induced eddy current. The second linking member 314 and the fourth linking member 318 may be configured to break resonance mode or reduce mechanical vibrations generated due to y-axis gradient coil induced eddy current. In other embodiments, the four linking members 312, 314, 316, 318 may be distributed unevenly along the circumferential direction.

Referring back to FIG. 7, the second set of linking members 254 is also mechanically coupled between the inner thermal shield member 202 and the main coil former 212 and is disposed at a second position along the axial direction 232. The second position is located in a region defined by the second main coil 216 having a medium size and a third main coil 218 having a small size. In some embodiments, the second position may be particularly selected to break additional resonance modes generated due to the gradient coil induced eddy current. Specific configuration of the second set of linking members 254 can be best seen with reference to FIG. 9, in which a cross-sectional view of the second set of linking members 254 is shown in accordance with one exemplary embodiment of the present disclosure.

Figure 9:
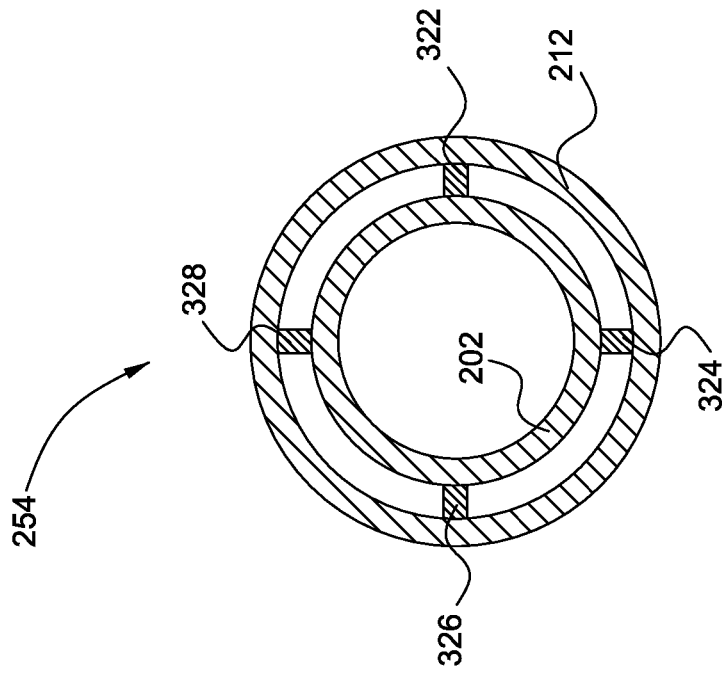
FIG. 9 is a radial cross-sectional view of a second set of inner radial linking members shown in FIG. 7 in accordance with an exemplary embodiment of the present disclosure.

As shown in FIG. 9, the second set of linking members 254 includes a first linking member 322, a second linking member 324, a third linking member 326, and a fourth linking member 328. The four linking members 322, 324, 326, 328 are disposed between and mechanically connected to the inner thermal shield member 202 and the main coil former 212. In some embodiments, boding materials such as epoxy may be used to secure one end of each of the four linking members 322, 324, 326, 328 with the main coil former 212, and fastening means such as screw may be used to secure another end of each of the four linking members 322, 324, 326, 328 with the inner thermal shield member 202. In the illustrated embodiment of FIG. 9, the four linking members 322, 324, 326, 328 are distributed evenly in the same plane and are spaced apart from one another by 90 degrees. More specifically, each of the four linking members 322, 324, 326, 328 forms a predetermined angle with respect to corresponding linking member in the first set of linking members 252. In a specific embodiment, the two linking members 318 and 328 may form an angle of 22.5 degrees. Similarly, linking member pairs 312, 322, linking member pairs 314, 324 and linking members 316, 326 all form angles of 22.5 degrees. However, the specific angle value should not be construed as limiting and any angle value may be formed between the linking members. In some embodiments, the four linking members 322, 324, 326, 328 may be distributed unevenly in the same plane.

Figure 10:
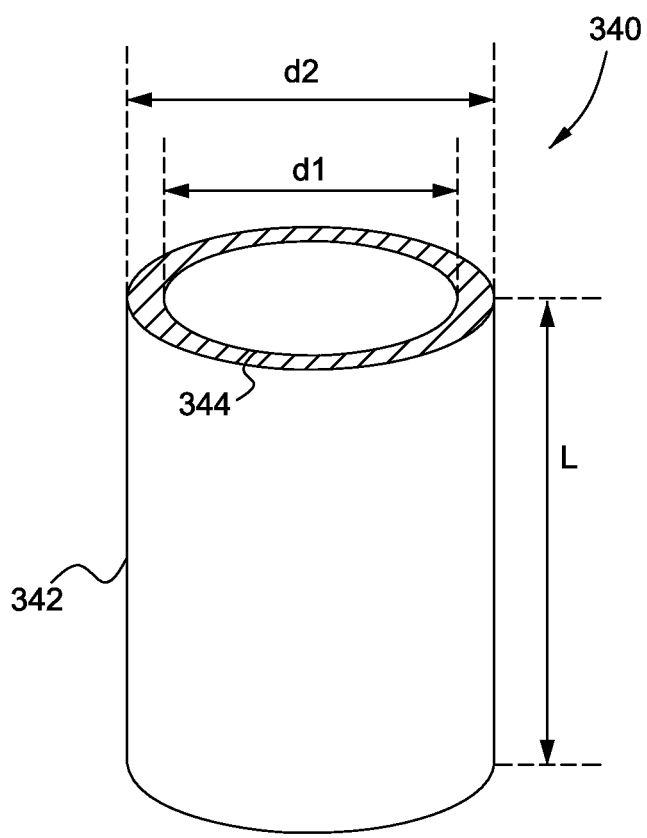
FIG. 10 is a perspective view of a linking member shown in FIG. 7 in accordance with an exemplary embodiment of the present disclosure.

FIG. 10 is a perspective view of a linking member 340 that may be used in the thermal shield assembly 250 shown in FIG. 7 in accordance with an exemplary embodiment of the present disclosure. As shown in FIG. 10, the linking member 340 is constructed to have a hollow structure. The linking member 340 may be made of material having high rigidity for providing sufficient stiffening and high thermal resistance for minimizing heat load. Non-limiting examples of the material that may be used for making the linking member 340 may include carbon graphite. The linking member 340 includes an inner cylindrical surface 344 having an inner diameter of $d_1$ and an outer cylindrical surface 342 having an outer diameter of $d_2$. The linking member 340 also has a length of L. The specific values of the inner diameter $d_1$, outer diameter $d_2$, and length L can be optimized according to practical requirements.

Figure 11:
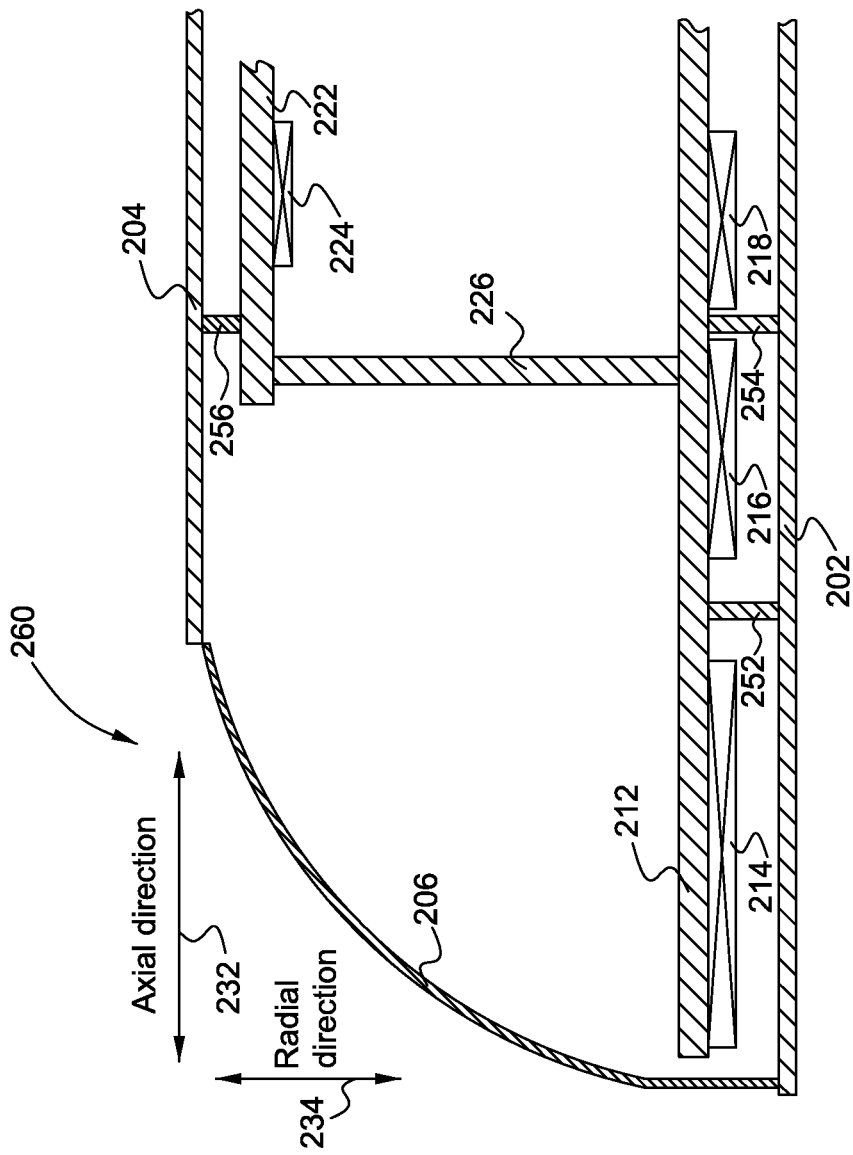
FIG. 11 is a cross-sectional side view of at least a part of a thermal shield assembly in association with other components of the imaging system shown in FIG. 1 in accordance with another exemplary embodiment of the present disclosure.

FIG. 11 is a cross-sectional side view of at least a part of a thermal shield assembly 260 in association with other components of the imaging system 10 shown in FIG. 1 in accordance with another exemplary embodiment of the present disclosure. The general structure of the thermal shield assembly 260 shown in FIG. 11 is substantially similar to the thermal shield assembly 250 shown and described with reference to FIG. 7, thus, similar elements shown in FIG. 11 are designated with the same reference numerals as those shown in FIG. 7 and detailed descriptions of these elements will not be described in detail.

As noted above with reference to FIG. 7, a first set of inner linking members 252 and a second set of inner linking members 254 are provided for stiffening the inner thermal shield member 202 by making a rigid connection with the main coil former 212. In the illustrated embodiment of FIG. 11, the thermal shield assembly 260 may further include a set of outer linking members 256. Although only one set of outer linking members 256 is shown, in other embodiments, the thermal shield assembly 260 may include more than one set of outer linking members that may be spaced apart along the axial direction 232. The set of outer linking members 256 is disposed between the outer thermal shield member 204 and the bucking coil former 222. Similar to the inner linking member set 252, 254, the outer linking member set 256 may include multiple linking members which may be distributed evenly or unevenly in the same plane. The set of outer linking members 256 are mechanically connected to the bucking coil former 222 and the outer thermal shield member 204 to increase the mechanical rigidity of the thermal shield assembly 260. In one embodiment, bonding material such as epoxy can be used to secure one end of the outer linking member 256 with the bucking coil former 222 and fastening means such as screw can be used to secure the other end of the outer linking member 256 with the outer thermal shield member 204. With the introduction of the set of outer linking members 256, one or more resonance modes of the thermal shield assembly 260 can be broken or mechanical vibrations of the thermal shield assembly 260 can be reduced. As a result, excessive cryogen boil-off can be avoided during the operation of the imaging system 10.

Figure 12:
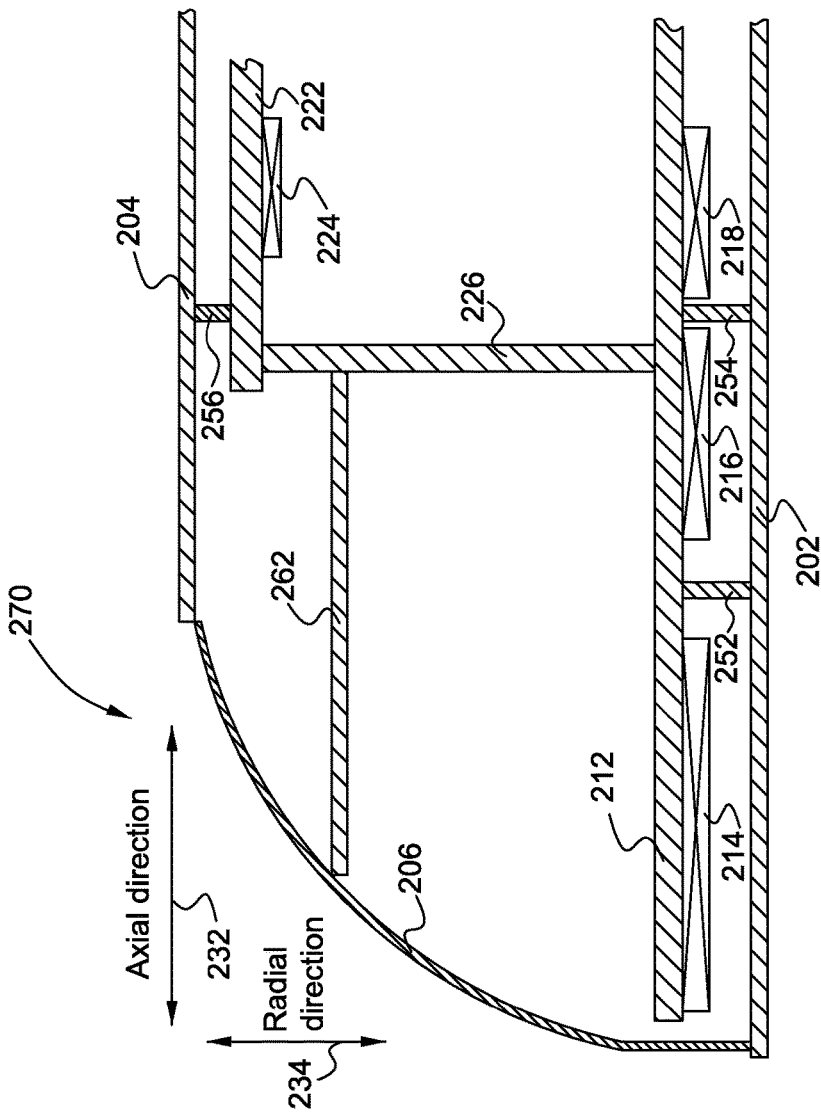
FIG. 12 is a cross-sectional side view of at least a part of a thermal shield assembly in association with other components of the imaging system shown in FIG. 1 in accordance with another exemplary embodiment of the present disclosure.

FIG. 12 illustrates a cross-sectional side view of at least a part of a thermal shield assembly 270 in association with other elements of the imaging system 10 shown in FIG. 1 in accordance with an exemplary embodiment of the present disclosure. The general structure of the thermal shield assembly 270 shown in FIG. 12 is substantially similar to the thermal shield assembly 260 shown and described with reference to FIG. 11, thus, similar elements shown in FIG. 12 are designated with the same reference numerals as those shown in FIG. 11 and detailed descriptions of these elements will not be described in detail.

In the illustrated embodiment of FIG. 12, the thermal shield assembly 270 may further include a plurality of axial linking members 262. The plurality of axial linking members 262 may be disposed between the flange 206 and the support member 226. More specifically, one end of each axial linking member 262 may be fastened to the flange 206 by one or more fastening means such as screws and the other end of each axial linking member 262 may be firmly connected to the support member 226 by using bonding materials such as epoxy. Using the plurality of axial linking members 262 to make a rigid mechanical connection between the flange 206 and the support member 226 can further increase the mechanical rigidity of the thermal shield assembly 270. Therefore, more resonance modes of the thermal shield assembly 270 generated due to gradient coil induced eddy current can be broken or mechanical vibrations generated therefrom can be reduced. Consequently, excessive cryogen boil-off can be avoided during the operation of the imaging system 10.

FIG. 13 illustrates a cross-sectional side view of at least a part of a thermal shield assembly 280 in association with other elements of the imaging system 10 shown in FIG. 1 in accordance with an exemplary embodiment of the present disclosure. The general structure of the thermal shield assembly 280 shown in FIG. 13 is substantially similar to the thermal shield assembly 260 shown and described with reference to FIG. 11, thus, similar elements shown in FIG. 13 are designated with the same reference numerals as those shown in FIG. 11 and detailed descriptions of these elements will not be described in detail.

In the illustrate embodiment of FIG. 13, the thermal shield assembly 280 may include a plurality of discrete gusset members 264 connected with the support member 226 and the main coil former 212 to reinforce or stiffen the support member 226. In some embodiments, the plurality of gusset members 264 may be formed integrally with the support member 226 or integrally with the main coil former 212. The thermal shield assembly 280 may further include one or more axial linking members 262 which may be disposed between the flange 206 and the gusset member 264. More specifically, in some embodiments, one end of each axial linking member 262 may be firmly connected to the flange 206 by one or more fastening means such as screw and the other end of each axial linking member 262 may be firmly connected to the gusset member 264 using bonding materials such as epoxy. The mechanical rigidity of the thermal shield assembly 280 can be further increased by making rigid mechanical connections between the flange 206 and the gusset member 264 through one or more axial linking members 262. Therefore, more resonance modes of the thermal shield assembly 280 generated due to gradient coil induced eddy current can be broken or mechanical vibrations generated therefrom can be reduced. Consequently, excessive cryogen boil-off can be avoided during the operation of the imaging system 10.

FIG. 14 illustrates experiment results of joule heating power versus frequency generated by a conventional thermal shield assembly and one proposed improved thermal shield assembly in accordance with an exemplary embodiment of the present disclosure. As shown in FIG. 14, a first curve generally designated by reference numeral 412 represents the joule heating power as a function of frequency generated by a conventional thermal shield configuration. A second curve generally designated by reference numeral 414 represents the joule heating power generated by one proposed thermal shield provided with stiffening means disclosed herein. The conventional thermal shield is not stiffened by means as proposed by the present disclosure, thus, relatively high joule heating power about 0.5 W occur at around frequency of about 600 Hz. From the second curve 414, it can be seen the peak joule heating power is only about 0.1 W around about 750 Hz. This can prove that the proposed thermal shield configuration with stiffening means can reduce the mechanical vibrations generated due to gradient coil induced eddy current. Therefore, during MR imaging, excessive cryogen boil-off can be avoided and potentially quench of the main magnet can also be avoided.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A magnetic resonance imaging system, comprising:
   at least one gradient coil configured for generating at least one gradient field along at least one direction in response to pulsed signals supplied thereto;
   at least one coil former configured for attaching at least one coil thereto, which comprises a main coil former and a bucking coil former connected to each other via at least one support member;
   a thermal shield assembly arranged adjacent to the at least one coil former, which comprises an inner thermal shield member, an outer thermal shield member spaced apart from the inner thermal shield member, and a flange member joining the inner thermal shield member and the outer thermal shield member, wherein the main coil former is arranged adjacent to the inner thermal shield member and the bucking coil former is arranged adjacent to the outer thermal shield member;
   a plurality of inner linking members that mechanically couple the inner thermal shield member with the main coil former;
   a plurality of outer linking members that mechanically couple the outer thermal shield member with the bucking coil former; and
   at least one axial linking member that mechanically couple the flange member and the at least one support member.

2. The magnetic resonance imaging system of claim 1, wherein the thermal shield assembly further comprises at least one gusset member connected to the support member and the main coil former for reinforcing the at least one support member.

3. The magnetic resonance imaging system of claim 1, wherein the flange member comprises at least two flanges joining the inner thermal shield member with the outer thermal shield member.

4. A magnetic resonance imaging system comprising:
   at least one gradient coil configured for generating at least one gradient field along at least one direction in response to pulsed signals supplied thereto;
   at least one coil former configured for attaching at least one coil thereto, which comprises a main coil former;
   a thermal shield assembly arranged adjacent to the at least one coil former, which comprises an inner thermal shield member, an outer thermal shield member spaced apart from the inner thermal shield member, and two flanges joining the inner thermal shield member with the outer thermal shield member, wherein the main coil former is arranged adjacent to the inner thermal shield member;
   a first series of radial linking members passing through the main coil former at a first axial position, wherein the first series of radial linking members mechanically couple the inner thermal shield member with the outer thermal shield member along a radial direction; and
   a second series of radial linking members passing through the main coil former at a second axial position different than the first axial direction, wherein the second series of radial linking members mechanically couple the inner thermal shield member with the outer thermal shield member along the radial direction.

5. The magnetic resonance imaging system of claim 4, wherein the at least one coil former further comprises a bucking coil former supported by the main coil former, the second series of radial linking members further pass through the bucking coil, and the second series of radial linking members are mechanically coupled to the bucking coil former.

6. The magnetic resonance imaging system of claim 4, wherein the first series of radial linking members are equally distributed in a first plane, the second series of radial linking members are equally distributed in a second plane, each of the first series of radial linking member forms a predetermined non-zero angle with respect to each of the second series of radial linking member.

7. The magnetic resonance imaging system of claim 4, further comprising a first series of axial linking members mechanically coupled between the two flanges at a first radial position.

8. The magnetic resonance imaging system of claim 7, further comprising a second series of axial linking members mechanically coupled between the two flanges at a second radial position different than the first radial position.

9. A magnetic resonance imaging system, comprising:
   at least one gradient coil configured for generating at least one gradient field along at least one direction in response to pulsed signals supplied thereto;
   at least one coil former configured for attaching at least one coil thereto, the at least one coil former comprising a main coil former;
   a thermal shield assembly arranged adjacent to the at least one coil former, which comprises an inner thermal shield member, an outer thermal shield member spaced apart from the inner thermal shield member, and two flanges joining the inner thermal shield member and the outer thermal shield member;
   at least one radial linking member that mechanically couples the inner thermal shield member with the outer thermal shield member along a radial direction; and
   at least one axial linking member that mechanically couples the two flanges along an axial direction,
   wherein the at least one radial linking member passes through the main coil former.

10. The magnetic resonance imaging system of claim 9, wherein the at least one coil former further comprises a bucking coil former and at least one support member that couples the main coil former with the bucking coil former, the at least one axial linking member passes through the at least one support member.

* * * * *